(12) United States Patent
Waida

(10) Patent No.: US 7,396,391 B2
(45) Date of Patent: Jul. 8, 2008

(54) ELECTRONIC CONTROL APPARATUS

(75) Inventor: Kazuma Waida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 499 days.

(21) Appl. No.: 11/212,842

(22) Filed: Aug. 29, 2005

(65) Prior Publication Data
US 2006/0054019 A1    Mar. 16, 2006

(30) Foreign Application Priority Data
Sep. 11, 2004    (JP)    ............................. 2004-325306

(51) Int. Cl.
*B01D 53/22* (2006.01)
(52) U.S. Cl. ............... 96/4; 96/12; 55/385.1; 55/385.2; 55/385.4
(58) Field of Classification Search ............ 96/4, 96/11, 12, 14, 134; 55/385.1, 385.2, 385.4, 55/495, 504, 505; 220/361, 363
See application file for complete search history.

(56) References Cited

U.S. PATENT DOCUMENTS

| | | | | |
|---|---|---|---|---|
| 4,957,518 A | * | 9/1990 | Brassell | 96/4 |
| 5,215,312 A | * | 6/1993 | Knappe et al. | 277/312 |
| 5,407,760 A | * | 4/1995 | Kasner et al. | 429/54 |
| 5,891,223 A | * | 4/1999 | Shaw et al. | 55/385.4 |
| 5,914,415 A | * | 6/1999 | Tago | 55/385.4 |
| 6,178,747 B1 | * | 1/2001 | Tang | 60/585 |
| 6,827,232 B1 | * | 12/2004 | Hara et al. | 220/371 |
| 6,840,982 B2 | * | 1/2005 | Kunstadt et al. | 96/4 |
| 7,083,660 B2 | * | 8/2006 | Hara et al. | 55/385.4 |
| 2005/0091949 A1 | * | 5/2005 | Origlia | 55/385.4 |
| 2006/0086249 A1 | * | 4/2006 | Burban et al. | 96/4 |

FOREIGN PATENT DOCUMENTS

| | | | |
|---|---|---|---|
| EP | 0 706 954 A1 | * | 10/1994 |
| JP | 2001-332871 | * | 11/2001 |
| JP | 2001-332871 A | | 11/2001 |

* cited by examiner

*Primary Examiner*—Jason M Greene
(74) *Attorney, Agent, or Firm*—Sughrue Mion, PLLC

(57) ABSTRACT

A venting aperture is formed in an upper wall of a casing, a gas-permeable membrane supporting body is mounted to the casing so as to communicate between the venting aperture and an external portion through a communicating aperture, and a gas-permeable membrane is disposed so as to shut off the communicating aperture. A cylindrical protective wall is disposed so as to protrude integrally from the casing so as to surround the gas-permeable membrane supporting body. A leading edge region of an external surface of the protective wall is formed so as to have an inclined surface in which a wall thickness gradually decreases from a root end toward a leading edge, and a groove having a groove direction in a direction of projection of the protective wall is formed so as to extend from a root of the protective wall to a leading edge and so as to communicate between an internal portion and an external portion of the protective wall.

3 Claims, 4 Drawing Sheets

ELECTRONIC CONTROL APPARATUS

BACKGROUND OF THE INVENTION

1. Field of the Invention

The present invention relates to an electronic control apparatus in which an electronic control device is housed inside a sealed casing in an automobile, a motorcycle, an outboard motor, etc.

2. Description of the Related Art

In an electronic control apparatus of this kind, when used under conditions in which a temperature difference inside and outside the casing is great, for example, there has been a risk that the air inside may expand or contract, thereby deforming the casing and leading to damage to a seal portion. Thus, conventionally, a preventive construction has been adopted in which an air vent is formed in a surface of the casing, and a gas-permeable membrane that shuts off passage of liquids and permits passage of gases is disposed so as to cover the air vent. By adopting this preventive construction, if a temperature difference arises inside and outside the casing, air flows through the gas-permeable membrane, an activity called "breathing", preventing buildup of pressure differences due to expansion and contraction of the air inside the casing, whereby deformation of the casing is prevented preemptively and damage to the seal portion does not occur.

However, one problem has been that if water, etc., adheres to the gas-permeable membrane and freezes, the gas-permeable membrane may lose permeability and become unable to breathe.

In view of this situation, an electronic control device has been proposed in which an air vent is formed in the casing, a gas-permeable membrane that shuts off passage of liquids and permits passage of gases is disposed so as to cover the air vent, a hood is disposed so as to be aligned generally horizontally so as to cover a vicinity of the gas-permeable membrane, an auxiliary air vent is opened though a peripheral wall below the hood, and a protective wall is disposed around the hood so as to be aligned generally horizontally. (See Patent Literature 1, for example.)

In the conventional electronic control apparatus described in Patent Literature 1, the protective wall is formed so as to have a cylindrical shape, an inner surface of an upper peripheral wall is formed so as to have an inclined shape sloping downward inside, and grooves are opened in a lower peripheral wall. Thus, even if water, etc., flows over wall surfaces of the protective wall from outer surfaces of the upper wall to inner surfaces thereof, the water, etc., flows down and inward over an inner surface of the inclined shape, and then flows downward inside the protective wall, and is discharged externally by the grooves. In this manner, the problem of the gas-permeable membrane losing permeability due to water, etc., accumulating inside the protective wall, adhering to the gas-permeable membrane, and freezing is prevented from arising.

Patent Literature 1: Japanese Patent Laid-Open No. 2001-332871 (Gazette)

An electronic control apparatus of this kind is made with a view to preventing deterioration in permeability of the gas-permeable membrane resulting from water, etc., that has entered inside the protective wall as a main objective, and no consideration has been given to problems such as tools, etc., contacting the protective wall and causing damage to the protective wall during mounting.

Specifically, the casing is generally mounted to a boss portion of an engine, for example, by fastening it with bolts, etc. Mounting of the casing is work in an environment surrounded by machinery, and tools such as spanners, wrenches, etc., employed in the fastening of the bolts may strike the protective wall.

In conventional electronic control apparatuses, the protective wall is disposed upright on a surface of the casing, and an outer peripheral surface is formed so as to have a cylindrical shape that is perpendicular to the surface of the casing. Thus, one problem has been that the outer peripheral surface of the protective wall takes the mechanical shock when tools strike the protective wall without mediation, damaging the protective wall, and in the worst cases, damaging the casing.

Damage to the protective wall may lead to exposure of and damage to the hood, and in the worst cases, the gas-permeable membrane may be damaged. If the casing is damaged, the seal on the casing may be lost.

SUMMARY OF THE INVENTION

The present invention aims to solve the above problems and an object of the present invention is to provide an electronic control apparatus enabling the occurrence of damage to a protective wall to be suppressed even if tools, etc., strike it, by adapting an outer wall surface shape of the protective wall so as to be able to alleviate mechanical shock.

In order to achieve the above object, according to one aspect of the present invention, there is provided an electronic control apparatus in which an electronic control device is housed inside a sealed casing, the electronic control apparatus including: a venting aperture formed on the casing; a gas-permeable membrane supporting body mounted to an outer wall surface of the casing, the gas-permeable membrane supporting body having a communicating aperture communicating between the venting aperture and an external portion; a gas-permeable membrane shutting off passage of liquids and permitting passage of gases, the gas-permeable membrane being interposed between the outer wall surface of the casing and the gas-permeable membrane supporting body, or installed inside the gas-permeable membrane supporting body, and being disposed so as to shut off a venting channel extending from the venting aperture through the communicating aperture to the external portion; and a protective wall disposed so as to protrude integrally from the outer wall surface of the casing so as to surround the gas-permeable membrane supporting body. The electronic control apparatus is characterized in that at least a leading edge region of an external surface in a direction of projection of the protective wall is formed so as to have an inclined surface such that a wall thickness gradually decreases from a root end toward a leading edge, and a groove having a groove direction in the direction of projection of the protective wall is formed so as to extend from a root of the protective wall to the leading edge and so as to communicate between an internal portion and an external portion of the protective wall.

According to the present invention, because an outer peripheral surface at least near a leading edge of the protective wall is formed so as to have an inclined surface, mechanical shock when tools, etc., strike the protective wall is alleviated by the inclined surface. Thus, the occurrence of damage to the protective wall resulting from mechanical shock from tools, etc., is suppressed. Because a groove extending from a root to a leading edge is formed in the protective wall, liquids such as water, oil, etc., will not accumulate inside the protective wall. Thus, adhesion of liquids to the gas-permeable membrane is prevented preemptively, enabling breathing to be reliably performed by the gas-permeable membrane, preemptively preventing deformation of the casing resulting from temperature differences inside and outside the casing.

DETAILED DESCRIPTION OF THE PREFERRED EMBODIMENTS

Embodiment 1

Figure 1:
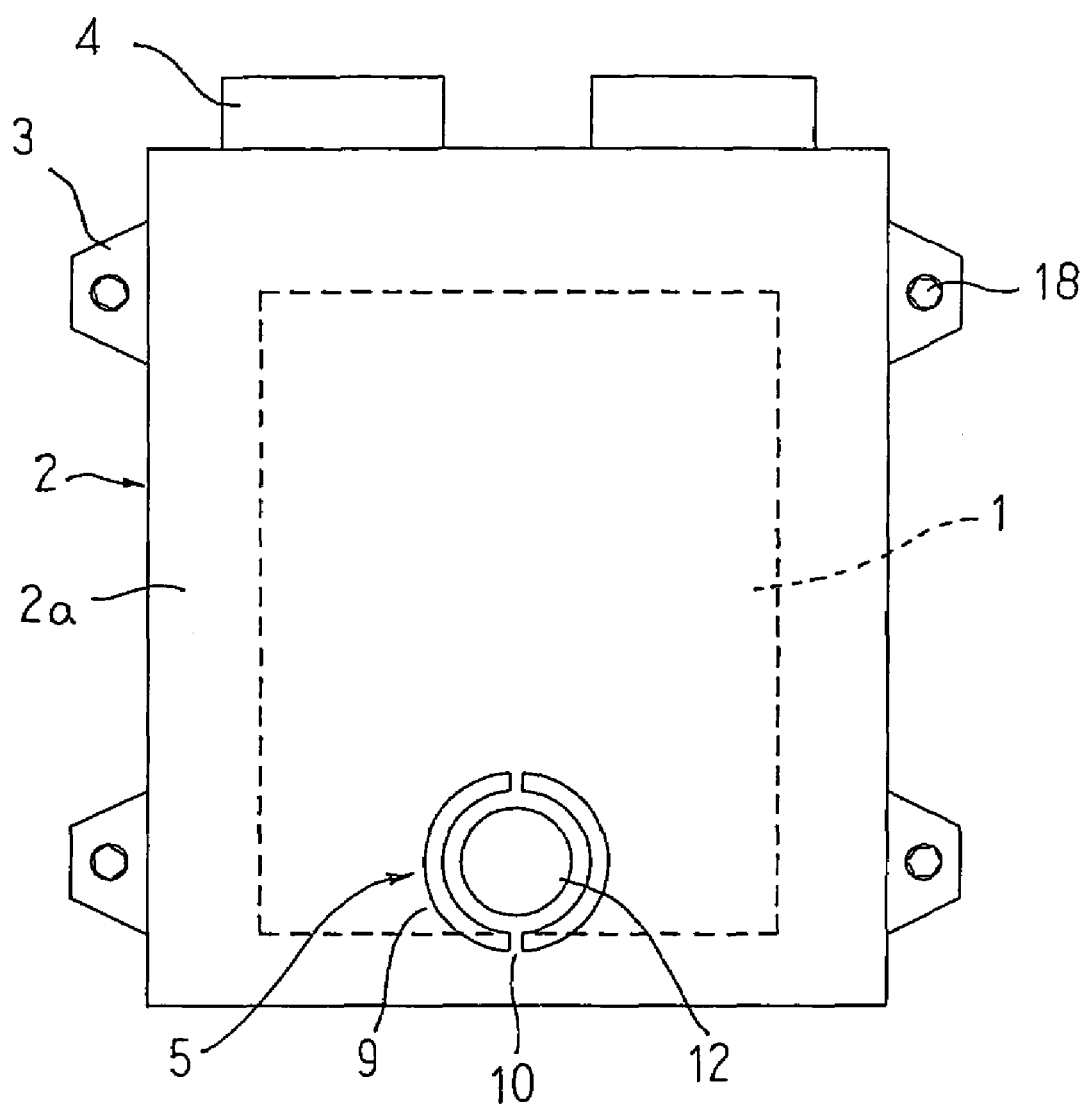
FIG. 1 is a top plan showing an electronic control apparatus according to Embodiment 1 of the present invention.
Figure 2:
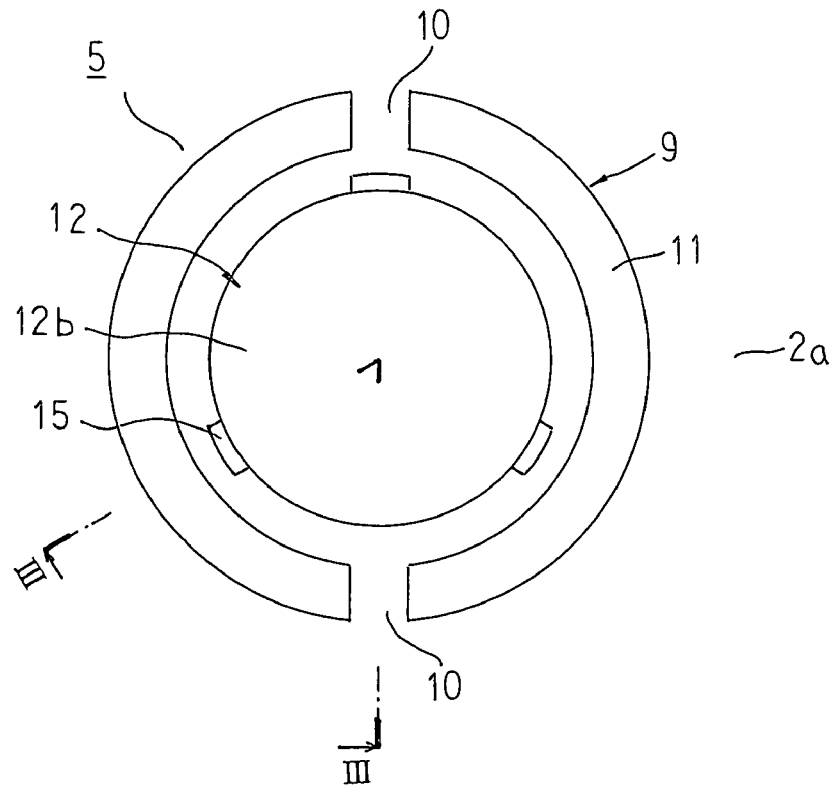
FIG. 2 is an enlarged top plan explaining part of the electronic control apparatus according to Embodiment 1 of the present invention.
Figure 3:
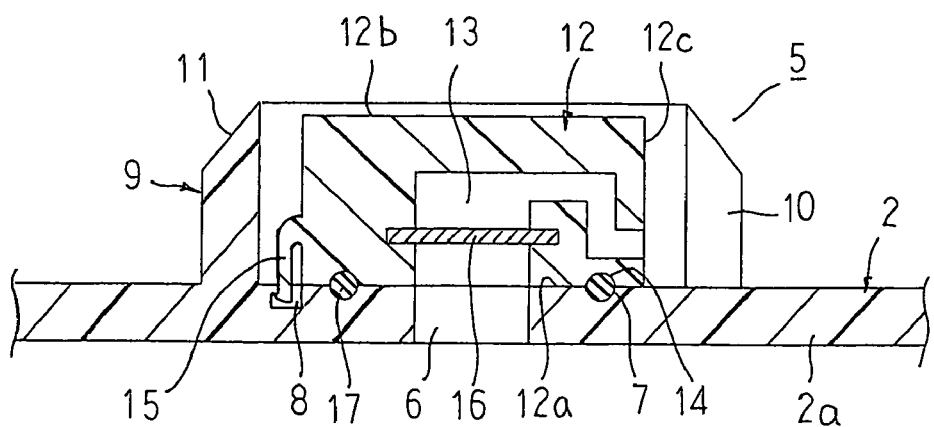
FIG. 3 is a cross section taken along line III-III in FIG. 2 viewed from the direction of the arrows.

FIG. 1 is a top plan showing an electronic control apparatus according to Embodiment 1 of the present invention, FIG. 2 is an enlarged top plan explaining part of the electronic control apparatus according to Embodiment 1 of the present invention, and FIG. 3 is a cross section taken along line III-III in FIG. 2 viewed from the direction of the arrows.

In FIG. 1, an electronic control device 1 performs electronic control of an engine, for example, and is configured by mounting various kinds of electronic components onto a circuit board. A casing 2 is for accommodating the electronic control device 1 inside, and is shaped into a box shape using a synthetic resin material such as a nylon or a polybutylene terephthalate (PBT) resin, etc. Then, although not shown, an electronic control device 1 is housed in an interior portion of the casing 2 through an opening, then the interior portion is sealed by attaching a cover plate to the opening with a sealing member interposed. Here, the casing 2 includes the cover plate and the sealing member.

Pairs of mounting flanges 3 are disposed so as to protrude from lower edges of a pair of facing side walls of the casing 2. A connector 4 is disposed so as to extend from one of the remaining side walls of the casing 2, and a venting mechanism portion 5 is configured into an upper wall 2a of the casing 2.

A specific construction of the venting mechanism portion 5 will now be explained with reference to FIGS. 2 and 3.

A venting aperture 6 is formed so as to pass through the upper wall 2a of the casing 2, and annular grooves 7 are recessed into an external surface of the upper wall 2a so as to surround the venting aperture 6 concentrically. Three engaging apertures 8 are recessed into the external surface of the upper wall 2a outside the annular grooves 7 at a uniform angular pitch so as to be positioned on a common circumference centered around the aperture center of the venting aperture 6. In addition, a cylindrical protective wall 9 is disposed so as to protrude integrally and perpendicularly from the upper wall 2a so as to surround the engaging apertures 8. Two grooves 10 having a groove direction in a direction of projection of the protective wall 9 are formed so as to extend from a root of the protective wall 9 to a leading edge, dividing the protective wall 9 into two sections in a circumferential direction. An outer peripheral surface near the leading edge of the protective wall 9 is formed so as to have an inclined surface 11 in which a wall thickness of the protective wall 9 gradually decreases linearly toward the leading edge. In addition, the leading edge of the protective wall 9 projects further than an upper surface 12b of a gas-permeable membrane supporting body 12 described below.

The gas-permeable membrane supporting body 12 is shaped into a disk shape using a synthetic resin material such as a nylon or a polybutylene terephthalate (PBT) resin, etc. A communicating aperture 13 is formed in the gas-permeable membrane supporting body 12 so as to extend from a bottom surface 12a toward the upper surface 12b so as to be perpendicular to the bottom surface 12a, then extend radially outward, then return toward the bottom surface 12a, and thereafter extend radially outward and open out at an outer peripheral surface 12c. This communicating aperture 13 opens through the outer peripheral surface 12c at a predetermined height position from the bottom surface 12a. An annular groove 14 is recessed into the bottom surface 12a so as to surround the communicating aperture 13. In addition, three engaging arms 15 are disposed so as to extend integrally from the outer peripheral surface 12c near the bottom surface 12a so as to correspond to aperture positions of the engaging apertures 8. Furthermore, a gas-permeable membrane 16 is installed inside the gas-permeable membrane supporting body 12 so as to shut off the communicating aperture 13. This gas-permeable membrane 16 is a functional membrane that shuts off passage of liquids and permits passage of gases, and for example, "GORE-TEX" (registered trademark), or "OLEOGARD" (registered trademark), etc., can be used.

This gas-permeable membrane supporting body 12 is mounted to the casing 2 by fitting the engaging arms 15 into the engaging apertures 8 from above with an O ring 17 mounted inside the annular groove 14. Thus, the engaging arms 15 are engaged in the engaging apertures 8 by their own elastic force, and the O ring 17 is held between the annular grooves 7 and 14 in a compressed state, ensuring airtightness and fluid tightness.

An electronic control apparatus configured in this manner, as shown in FIG. 1, is mounted to an engine by passing bolts 18 through mounting apertures (not shown) of the mounting flanges 3, and fastening them to a boss portion (not shown) of the engine, for example. At this time, the casing 2 is mounted with the upper wall 2a on which the venting mechanism portion 5 is configured in a generally horizontal state. Then, the electronic control device 1 is electrically connected to various sensors, injectors, etc., by means of the connector 4.

When a temperature difference inside and outside the casing 2 occurs, the air inside the casing 2 is discharged externally through a venting channel constituted by the venting aperture 6 and the communicating aperture 13 via the gas-permeable membrane 16, or external air is sucked inside the casing 2 through the venting channel constituted by the venting aperture 6 and the communicating aperture 13 via the gas-permeable membrane 16. Thus, the casing 2 breathes by means of the gas-permeable membrane 16, preventing buildup of pressure differences due to expansion and contraction of the air inside the casing, whereby deformation of the casing is prevented preemptively and damage to the seal portion does not occur.

Because the communicating aperture 13 opens through the outer peripheral surface 12c of the gas-permeable membrane supporting body 12, liquids such as water or oil, etc., will not enter the communicating aperture 13 directly.

Liquids that have penetrated inside the protective wall 9 are discharged externally by the grooves 10. Here, because the communicating aperture 13 opens at a predetermined height position from the bottom surface 12a, in other words from the external surface of the upper wall 2a, the liquids are discharged externally by the grooves 10 but will not enter the communicating aperture 13.

Because the communicating aperture 13 is formed into a vertically meandering aperture shape so as to extend from a bottom surface 12a toward the upper surface 12b so as to be perpendicular to the bottom surface 12a, then extend radially outward, then return toward the bottom surface 12a, and thereafter extend radially outward and open out at an outer peripheral surface 12c, liquids that have penetrated inside the protective wall 9 are also prevented from flowing back through the communicating aperture 13 and adhering to the gas-permeable membrane 16, etc.

The bolts 18 are fastened using tools such as spanners, wrenches, etc. These tools are rotated around central axes of the bolts 18 during use and may strike the protective wall 9 by accident. At such times, the tools will collide with the protective wall 9 from a direction perpendicular to the direction of projection of the protective wall 9.

Here, because the leading edge of the protective wall 9 projects further than the upper surface 12b of the gas-permeable membrane supporting body 12, collision of the tools with the gas-permeable membrane supporting body 12 is avoided, preemptively preventing damage to the gas-permeable membrane supporting body 12.

When the outer peripheral surface of a protective wall is formed so as to be perpendicular to the upper wall 2a, the tools strike the protective wall from a direction perpendicular to the outer peripheral surface, and the mechanical shock from the tools is taken directly by the outer peripheral surface of the protective wall. However, in Embodiment 1, because the outer peripheral surface near the leading edge of the protective wall 9 is formed so as to have an inclined surface 11, tools striking the inclined surface 11 from a direction perpendicular to the direction of projection of the protective wall 9 bounce upward. Thus, mechanical shock from the tools is effectively deflected, in other words alleviated, by the inclined surface 11, suppressing the occurrence of damage to the protective wall 9. As a result, the casing 2 is also prevented from being damaged and sealability lost, etc.

Because the protective wall 9 is also formed so as to have a cylindrical body, mechanical shock from tools is effectively alleviated, suppressing the occurrence of damage to the protective wall 9.

Embodiment 2

Figure 4:
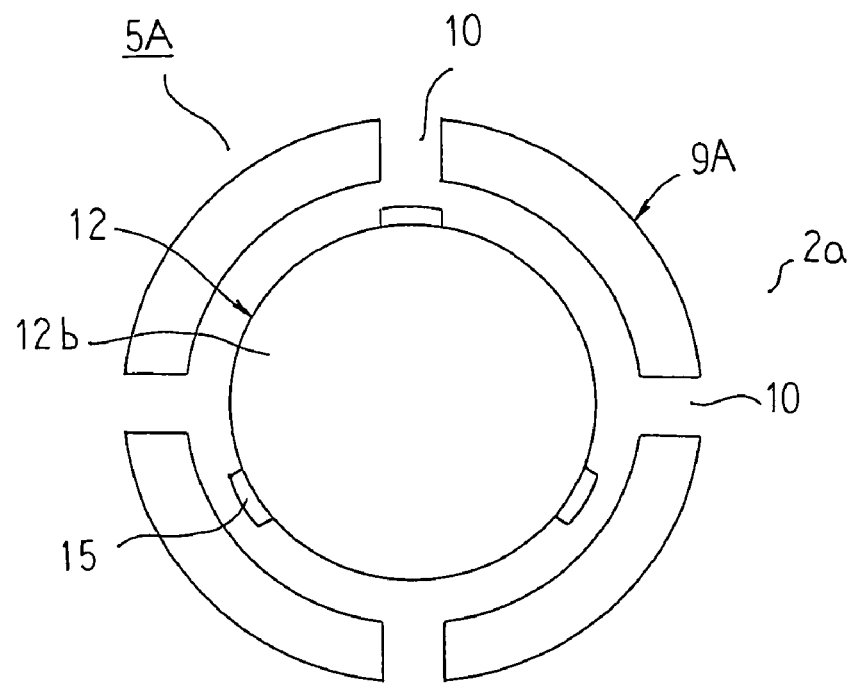
FIG. 4 is an enlarged top plan explaining part of an electronic control apparatus according to Embodiment 2 of the present invention.

FIG. 4 is an enlarged top plan explaining part of an electronic control apparatus according to Embodiment 2 of the present invention.

In FIG. 4, a protective wall 9A is divided into four parts in a circumferential direction by grooves 10.

Moreover, the rest of this embodiment is configured in a similar manner to Embodiment 1 above.

A venting mechanism portion 5A configured in this manner also operates in a similar manner to the venting mechanism portion 5 according to Embodiment 1 above. Consequently, similar effects to those in Embodiment 1 above can also be achieved in Embodiment 2.

According to Embodiment 2, because the protective wall 9A is divided into four parts in a circumferential direction by the grooves 10, liquids that have penetrated inside the protective wall 9 are promptly are discharged externally by the grooves 10. Thus, breathing of the casing 2 by the gas-permeable membrane is reliably performed, enabling the occurrence of deformation of the casing 2 resulting from temperature differences inside and outside the casing 2 to be prevented.

Embodiment 3

Figure 5:
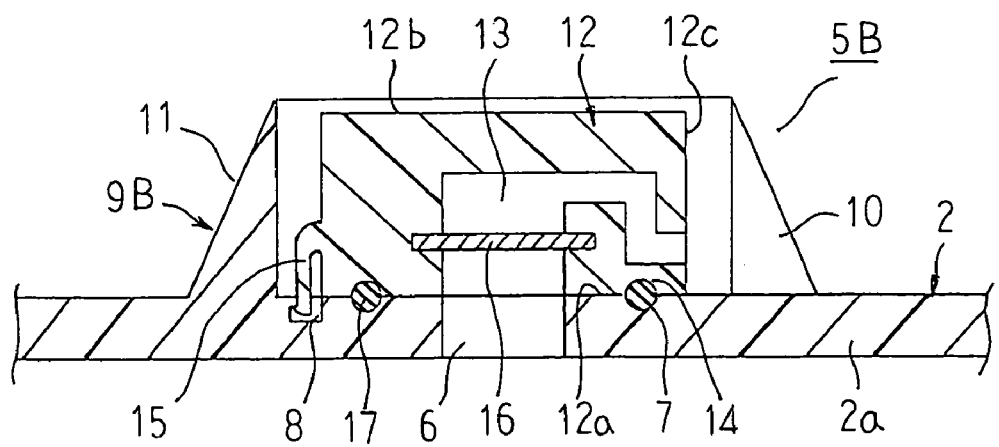
FIG. 5 is an enlarged cross section explaining part of an electronic control apparatus according to Embodiment 3 of the present invention.

FIG. 5 is an enlarged cross section explaining part of an electronic control apparatus according to Embodiment 3 of the present invention.

In FIG. 5, a protective wall 9B is formed so as to have an inclined surface 11 in which a wall thickness of the protective wall 9 gradually decreases linearly from a root toward a leading edge along an entire region of an outer peripheral surface in a direction of projection. In other words, the protective wall 9B is formed such that a cross-sectional shape passing through a central axis of a cylindrical shape thereof is triangular.

Moreover, the rest of this embodiment is configured in a similar manner to Embodiment 1 above.

A venting mechanism portion 5B configured in this manner also operates in a similar manner to the venting mechanism portion 5 according to Embodiment 1 above. Consequently, similar effects to those in Embodiment 1 above can also be achieved in Embodiment 3.

According to Embodiment 3, because the entire outer peripheral surface of the protective wall 9B is formed so as to have an inclined surface 11, mechanical shock from the tools is effectively deflected by the inclined surface 11 irrespective of the height position at which tools for fastening the bolts 18 strike the protective wall 9B, reliably suppressing the occurrence of damage to the protective wall 9B.

Embodiment 4

Figure 6:
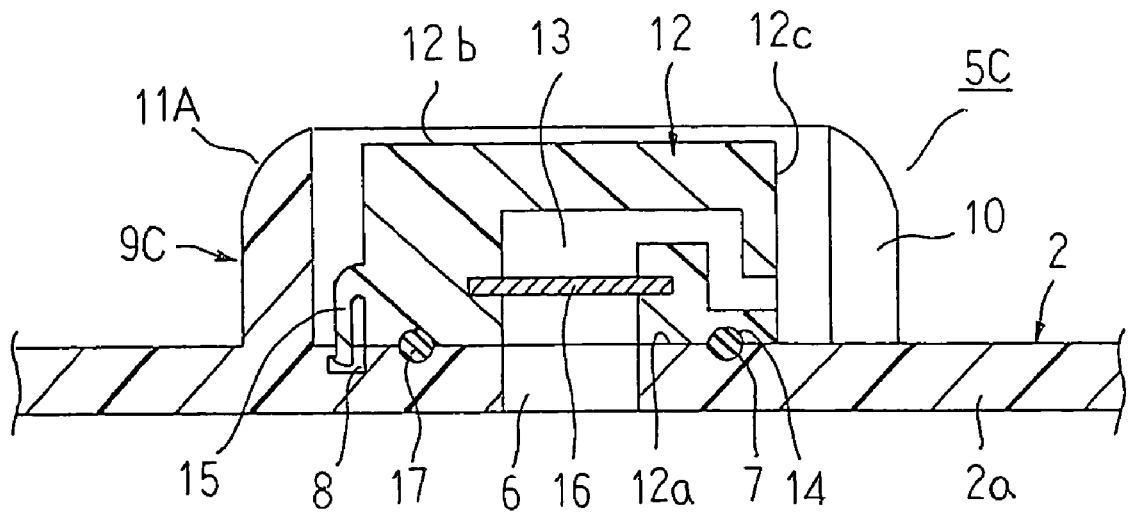
FIG. 6 is an enlarged cross section explaining part of an electronic control apparatus according to Embodiment 4 of the present invention.

FIG. 6 is an enlarged cross section explaining part of an electronic control apparatus according to Embodiment 4 of the present invention.

In FIG. 6, an outer peripheral surface near a leading edge of a protective wall 9 is formed so as to have a convex inclined surface 11A in which a wall thickness of the protective wall 9 gradually decreases toward the leading edge.

Moreover, the rest of this embodiment is configured in a similar manner to Embodiment 1 above.

A venting mechanism portion 5C configured in this manner also operates in a similar manner to the venting mechanism portion 5 according to Embodiment 1 above. Consequently, similar effects to those in Embodiment 1 above can also be achieved in Embodiment 4.

Embodiment 5

Figure 7:
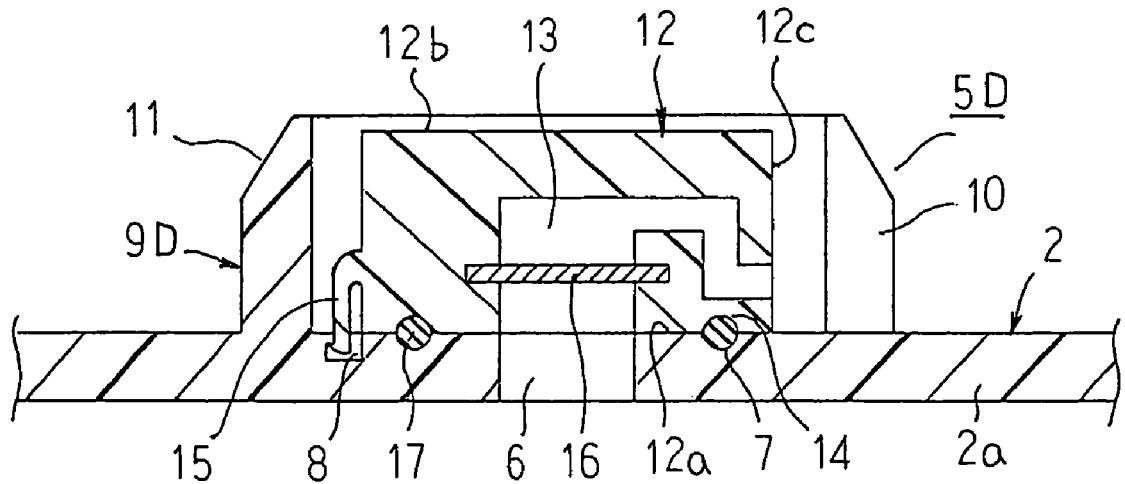
FIG. 7 is an enlarged cross section explaining part of an electronic control apparatus according to Embodiment 5 of the present invention.

FIG. 7 is an enlarged cross section explaining part of an electronic control apparatus according to Embodiment 5 of the present invention.

In FIG. 7, an outer peripheral surface near a leading edge of a protective wall 9D is formed so as to have an inclined surface 11 in which a wall thickness of the protective wall 9D gradually decreases linearly toward the leading edge. A leading edge portion of the protective wall 9D is formed so as to have a predetermined wall thickness.

Moreover, the rest of this embodiment is configured in a similar manner to Embodiment 1 above.

A venting mechanism portion 5D configured in this manner also operates in a similar manner to the venting mechanism portion 5 according to Embodiment 1 above. Consequently, similar effects to those in Embodiment 1 above can also be achieved in Embodiment 5.

According to Embodiment 5, because the leading edge portion of the protective wall 9D is formed so as to have a predetermined wall thickness, rigidity near the leading edge of the protective wall 9D is increased and impact resistance is improved, enabling the occurrence of damage to the protective wall 9D to be further suppressed.

Moreover, in each of the above embodiments, a gas-permeable membrane is installed inside a gas-permeable membrane supporting body so as to shut off a communicating aperture, but a gas-permeable membrane may also be disposed so as to be held between an external surface of an upper wall of a casing and a bottom surface of a gas-permeable membrane supporting body.

In each of the above embodiments, a leading edge of a protective wall projects further than an upper surface of a gas-permeable membrane supporting body, but a protective wall need only be positioned at least generally in a common plane with an upper surface of a gas-permeable membrane supporting body.

In each of the above embodiments, the casing is mounted horizontally such that a wall surface on which a venting mechanism portion is configured is an upper surface, but a casing may also be mounted such that a wall surface on which a venting mechanism portion is configured is a vertical surface. In that case, the venting mechanism portion should be configured such that grooves in a protective wall are positioned downward.

In each of the above embodiments, a protective wall is formed so as to have a cylindrical body, but the protective wall is not limited to a cylindrical body provided that it has a shape that can surround a gas-permeable membrane supporting body and, for example, may also be a tubular body having a quadrilateral shape, or even a tubular body having a polygonal shape such as a hexagon, or an octagon, etc. In addition, cylindrical or polygonal prism, etc., protruding portions may also be disposed so as to protrude from a casing around a gas-permeable membrane supporting body with a predetermined spacing so as to surround the gas-permeable membrane supporting body to constitute a protective wall. However, from the viewpoint of alleviating mechanical shock, it is desirable for the protective wall to have a cylindrical body.

In each of the above embodiments, a gas-permeable membrane supporting body is constituted by a single part, but a gas-permeable membrane supporting body may also be constituted, for example, by: a main body portion having a communicating aperture, mounted to the casing such that a communicating aperture is aligned with a venting aperture; and a cap portion fitted on so as to cover a leading end portion of the main body portion. In that case, it is only necessary for a gap to be formed between the cap portion and the main body portion so as to extend radially outward from an upper portion opening of the communicating aperture, and then extend toward the casing, and extend outside. Then, a gas-permeable membrane need only be installed in the main body portion so as to shut off the communicating aperture.

In each of the above embodiments, a gas-permeable membrane supporting body is mounted to a casing by fitting engaging arms disposed so as to extend from an outer peripheral surface of the gas-permeable membrane supporting body into engaging apertures recessed into the casing, but a gas-permeable membrane supporting body may also be mounted to a casing by disposing engaging arms so as to extend from an opening portion of a communicating aperture on a bottom surface of the gas-permeable membrane supporting body, and fitting the engaging arms into a venting aperture of the casing. In that case, engaging apertures are no longer necessary, improving producibility of the casing.

In each of the above embodiments, a gas-permeable membrane supporting body is mounted to a casing by fitting engaging arms and engaging apertures together, but the method for mounting the gas-permeable membrane supporting body is not limited to this, and the gas-permeable membrane supporting body may also be mounted to the casing by fastening using a screw, or by heat welding, etc.

What is claimed is:

1. An electronic control apparatus in which an electronic control device is housed inside a sealed casing, said electronic control apparatus comprising:
    a venting aperture formed on said casing;
    a gas-permeable membrane supporting body mounted to an outer wall surface of said casing, said gas-permeable membrane supporting body having a communicating aperture communicating between said venting aperture and an external portion;
    a gas-permeable membrane shutting off passage of liquids and permitting passage of gases, said gas-permeable membrane being interposed between said outer wall surface of said casing and said gas-permeable membrane supporting body or installed inside said gas-permeable membrane supporting body, and being disposed so as to shut off a venting channel extending from said venting aperture through said communicating aperture to said external portion; and
    a protective wall disposed so as to protrude integrally from said outer wall surface of said casing so as to surround said gas-permeable membrane supporting body,
    wherein:
    at least a leading edge region of an external surface in a direction of projection of said protective wall is formed so as to have an inclined surface such that a wall thickness gradually decreases from a root end toward a leading edge, and
    a groove having a groove direction in said direction of projection of said protective wall is formed so as to extend from a root of said protective wall to said leading edge and so as to communicate between an internal portion and an external portion of said protective wall.

2. The electronic control apparatus according to claim 1, wherein:
    said inclined surface is formed over an entire region of said external surface of said protective wall.

3. The electronic control apparatus according to claim 1, wherein:
    a plurality of said grooves are formed so as to divide said protective wall into four parts in a circumferential direction.

* * * * *